United States Patent [19]

Laidlaw

[11] Patent Number: 5,577,613
[45] Date of Patent: Nov. 26, 1996

[54] INTEGRATED CARRY HANDLE AND ACCESSORY INTERLOCK SYSTEM

[75] Inventor: Anthony G. Laidlaw, Boise, Id.

[73] Assignee: Hewlett-Packard Company, Palo Alto, Calif.

[21] Appl. No.: 524,947

[22] Filed: Sep. 6, 1995

[51] Int. Cl.⁶ .................................................. B65D 21/032
[52] U.S. Cl. ......................... 206/510; 206/509; 220/4.27; 220/770
[58] Field of Search .................................... 206/510, 511, 206/512, 509; 220/770, 23.6, 4.26, 4.27

[56] References Cited

U.S. PATENT DOCUMENTS

| 4,050,580 | 9/1977 | Wilson | 206/511 |
| 4,823,955 | 4/1989 | Apps | 206/510 |
| 5,190,156 | 3/1993 | Conaway et al. | 206/511 |
| 5,423,445 | 6/1995 | Montanari et al. | 206/511 |

FOREIGN PATENT DOCUMENTS

674883  11/1964  Italy ....................... 206/510
1253561 11/1971 United Kingdom .................. 206/511

Primary Examiner—Stephen J. Castellano

[57] ABSTRACT

A carry handle and interlock system for stackable equipment units includes dual functionality in a simple yet elegant design. A primary unit, such as a computer printer, is provided with a housing shell that includes outwardly warped side panels that also form downwardly facing grooves in the side panels. The grooves are shaped and dimensioned for allowing fingers to be at least partially received within the grooves for lifting and moving the primary unit. The primary unit is made stackable with accessory units, such as sheet feeder paper trays, by providing each accessory unit with side panel projections that have an upwardly directed tongue designed to be inserted in the grooves of the primary unit, thereby interlocking the accessory unit subjacent the primary unit. The side panel projections also have downwardly directed recesses designed for either allowing fingers to be at least partially received with the recesses for lifting and moving the accessory unit or for receiving the tongue of a subjacently stacked second accessory unit. In such a stacked configuration, the user is coaxed into lifting a stack only by the bottom most accessory unit.

7 Claims, 8 Drawing Sheets

INTEGRATED CARRY HANDLE AND ACCESSORY INTERLOCK SYSTEM

FIELD OF THE INVENTION

The present invention relates generally to electronic equipment housings, more particularly to carry handles for computer equipment and, more specifically, to an integrated carry handle an accessory interlock system.

BACKGROUND OF THE INVENTION

Electronic equipment, such as personal computers, computer peripheral equipment, and computer accessories, is often designed with handles for facilitating movement of an equipment about an office or transportation to another locale. In general, such handles have only one purpose, to provide the user with a safe and easy way to carry the piece of equipment. However, desktop computers, computer peripheral equipment, and computer accessories are sometimes designed to be stacked one upon another. It is often important that certain pieces of equipment, for example, a printer and a printer accessory (such as a media sheet feeder), be properly stacked for appropriate interfacing of the two equipment pieces.

Therefore, there is a need for a device which facilitates both carrying and providing appropriate stacking of such equipment.

SUMMARY OF THE INVENTION

In its basic aspects, the present invention provides a carry handle and interlock system for a plurality of stackable equipment units. A first equipment unit has a first housing including at least one receiving handle forming a first mechanism for lifting the first equipment unit and for interlocking the first equipment unit with another of the stackable, equipment units. At least one second equipment unit has a second housing including at least one alignment handle forming a second mechanism for interlocking the second equipment unit with a superjacent stackable equipment unit and for lifting the second equipment unit and the superjacent stackable equipment units.

It is an advantage of the present invention that it allows the user to carry the equipment with handles integrated into the cover of the equipment.

It is another advantage of the present invention that it allows the user to properly locate and align any electronic equipment devices designed to be stacked together.

It is another advantage of the present invention that it prevents carrying a product and stacked accessories by handles other than those of the lowest equipment of a stack.

It is still another advantage of the present invention that it is an integral feature of the equipment housing, eliminating the need for extra piece parts.

It is yet another advantage of the present invention that it negates the need for any locking mechanisms between stacked pieces of equipment; the weight of each of the equipments themselves secure the equipment pieces together.

Other objects, features and advantages of the present invention will become apparent upon consideration of the following detailed description and the accompanying drawings, in which like reference designations represent like features throughout the FIGURES.

The drawings referred to in this description should be understood as not being drawn to scale except if specifically noted.

DETAILED DESCRIPTION OF THE INVENTION

Reference is made now in detail to a specific embodiment of the present invention, which illustrates the best mode presently contemplated by the inventor(s) for practicing the invention. Alternative embodiments are also briefly described as applicable.

Figure 1:
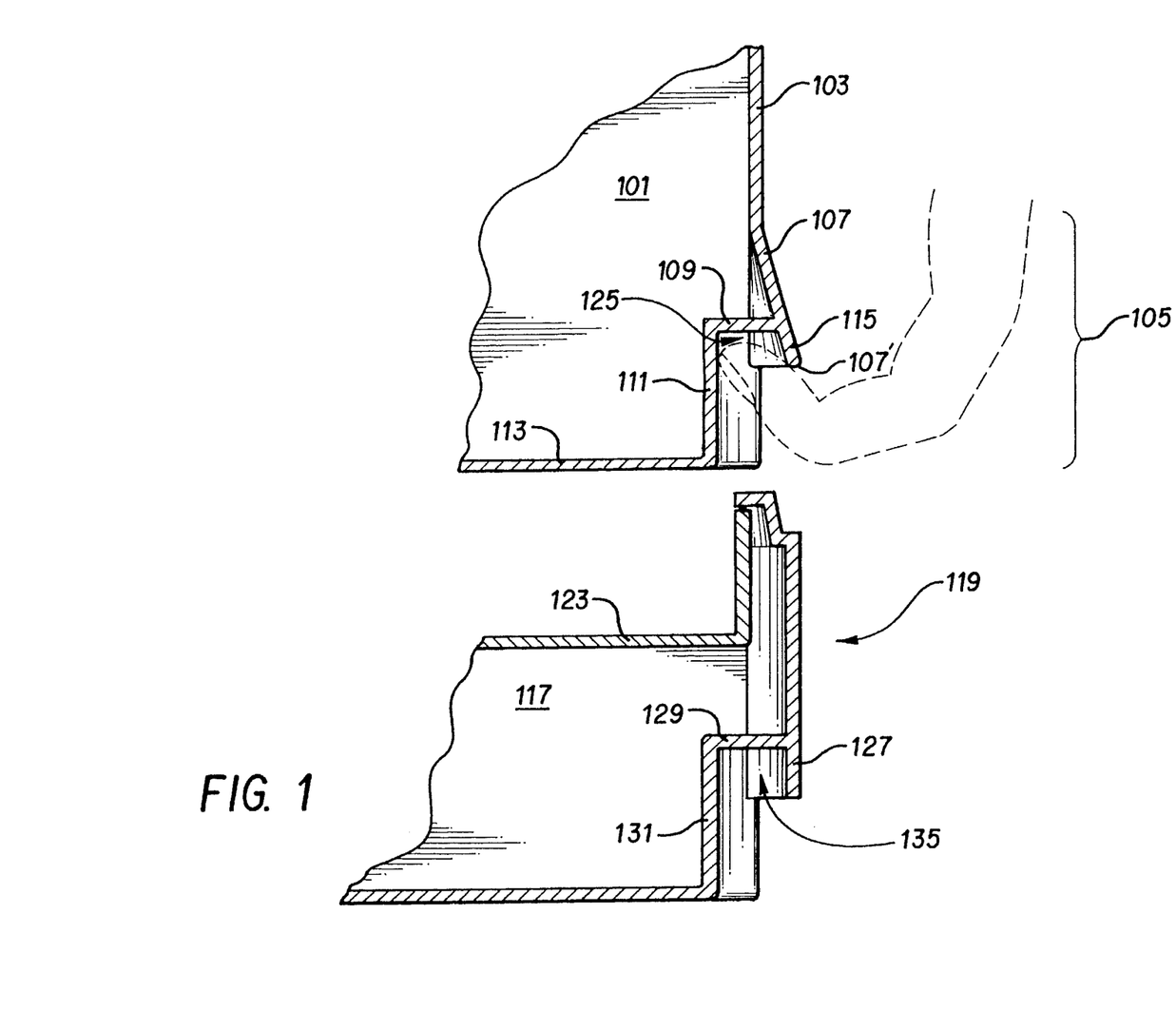
FIG. 1 is a schematic, plan view (front section) depicting a primary equipment unit and an accessory equipment unit incorporating the present invention with the equipment separated.

Referring to FIG. 1, a primary equipment unit 101—for example, a printer, a desktop computer central processing unit, or other electronic device—has a housing cover 103. It is customary to mold such covers 103 from a hard plastic material. The primary equipment unit 101 is provided with receiving handles 105. Generally, two such receiving handles 105 are provided symmetrically, one on each opposing side (one shown) of the cover 103. Exact location will be a function of a specific design, but generally the two handles 105 are located and sized such that lifting the primary equipment unit 101 by the handles 105 (demonstrated by the phantom line hand) is facilitated.

In the preferred embodiment, each receiving handle 105 includes a warp region 107 of the housing cover 103. The structural design of this warp region 107 is more clearly seen in FIGS. 3, 4, 5, and 6. It should be recognized in the preferred embodiment shown that the warp region 107 is designed to be both functional and aesthetically pleasing. Clearly, less aesthetic designs, such as a simple recess region, may be as functional as the preferred embodiment shown and can be substituted therefor within the scope of the present invention.

Returning to FIG. 1, the warp region 107 extends outwardly a predetermined horizontal distance from the cover 103. Above the lower most reach 107' of the warp region 107, a horizontal cross member 109 extends inwardly to where it joins a descending region, or wall, 111 of the housing cover 103, which in turn is inwardly displaced by the length of the cross member 109. Note that in a molded, rigid plastic embodiment, that the cross member 109 may be omitted provided that the plastic has a tensile strength sufficient to allow lifting the unit 101 without the structural reinforcement that the cross member 109 provides. The outward protrusion of the warp region 107 is minimized by having the cross member 109 reach a position that is inwardly located beyond the housing wall regions of the housing cover 103 above the warp region 107. The descending region 111 of the housing cover 103 meets a bottom housing member, or housing edge, 113 of the primary equipment unit 101 at a predetermined distance below the cross member 109—namely, at least a dimension such that lifting or lowering the primary equipment unit 101 will not pinch the fingers of the user. By this configuration, an angularly descending flange 115 of the warp region 107 protrudes and facilitates the grasping of the handles 105 with the fingers.

In other words, the handles 105 are warped surfaces that extend outwardly beyond the normal flat surface of a cubic style housing cover 103, forming a downward facing groove 125 that enables the user to grasp the handles 105 and pick up the primary equipment unit 101. Thus, in the preferred embodiment the handles 105 appear as slight bulges from the side of the equipment that present an aesthetically pleasing design.

The size and shape of the warp region 107 is further designed to interlock the unit 101 with accessory equipment units—for example, for a primary equipment unit 101 that is a hard copy apparatus, accessories such as compatible media stack feeder trays may be provided. An accessory equipment unit 117 is provided with a combination alignment-handle feature 119. Again, two such alignment-handles 119 are provided symmetrically, one on each opposing side (one shown) of the accessory equipment unit's housing cover 123. Exact location of the alignment-handles 119 will be a function of a specific design, but generally two alignment-handles 119 are located and sized such that lifting the primary equipment unit 101 by the handles 119 is facilitated (depicted by the phantom line hand in FIG. 2).

Figure 2:
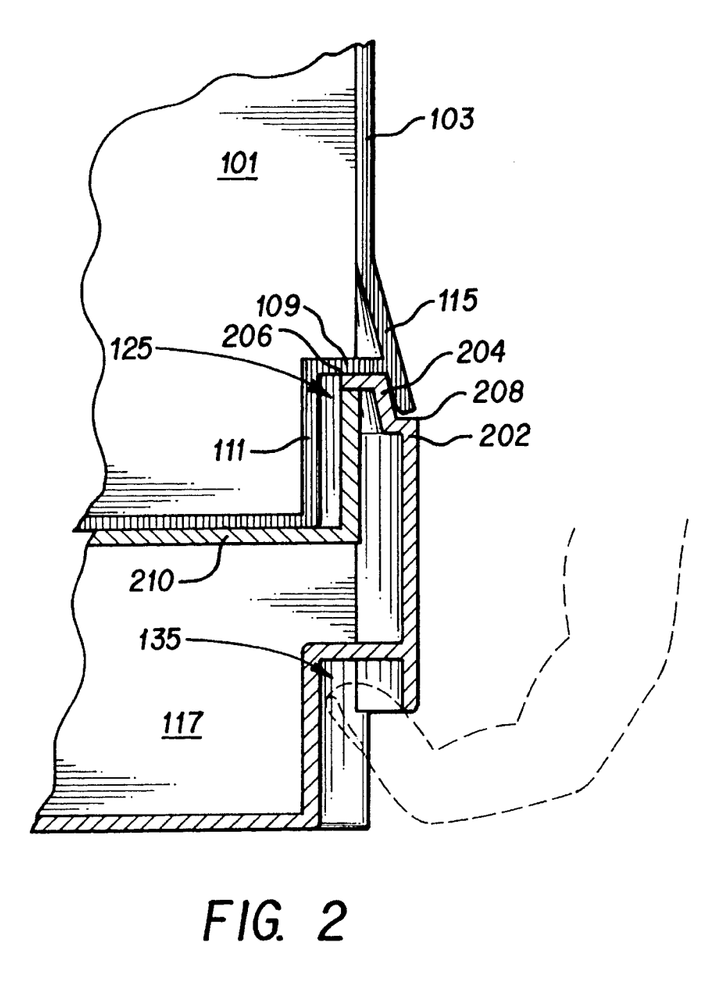
FIG. 2 is a schematic, plan view (front section) depicting a primary equipment unit and an accessory equipment unit incorporating the present invention with the equipment stacked together.
Figure 4:
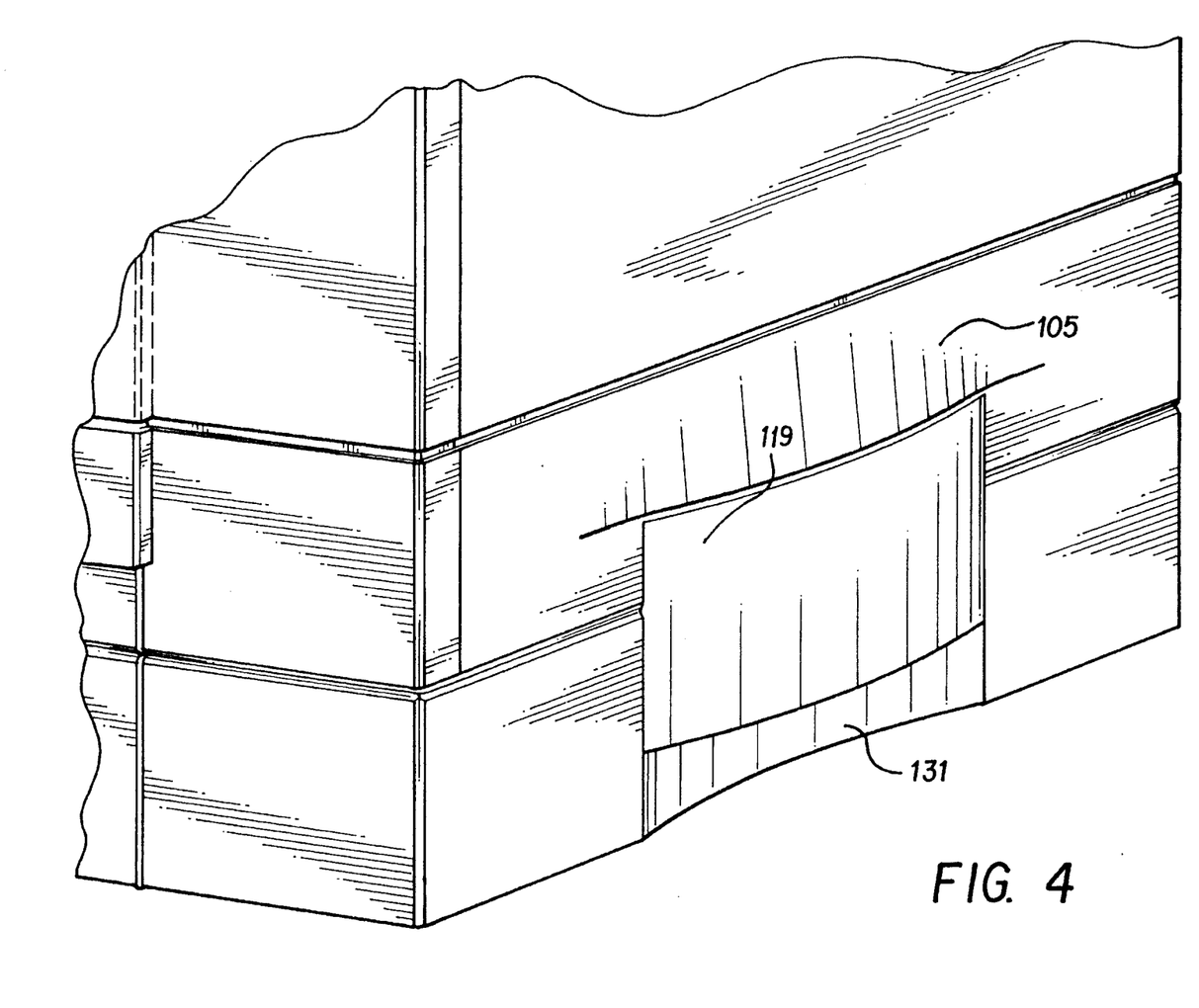
FIG. 4 is a perspective section view from an angle above the present invention as shown in FIG. 2.
Figure 6:
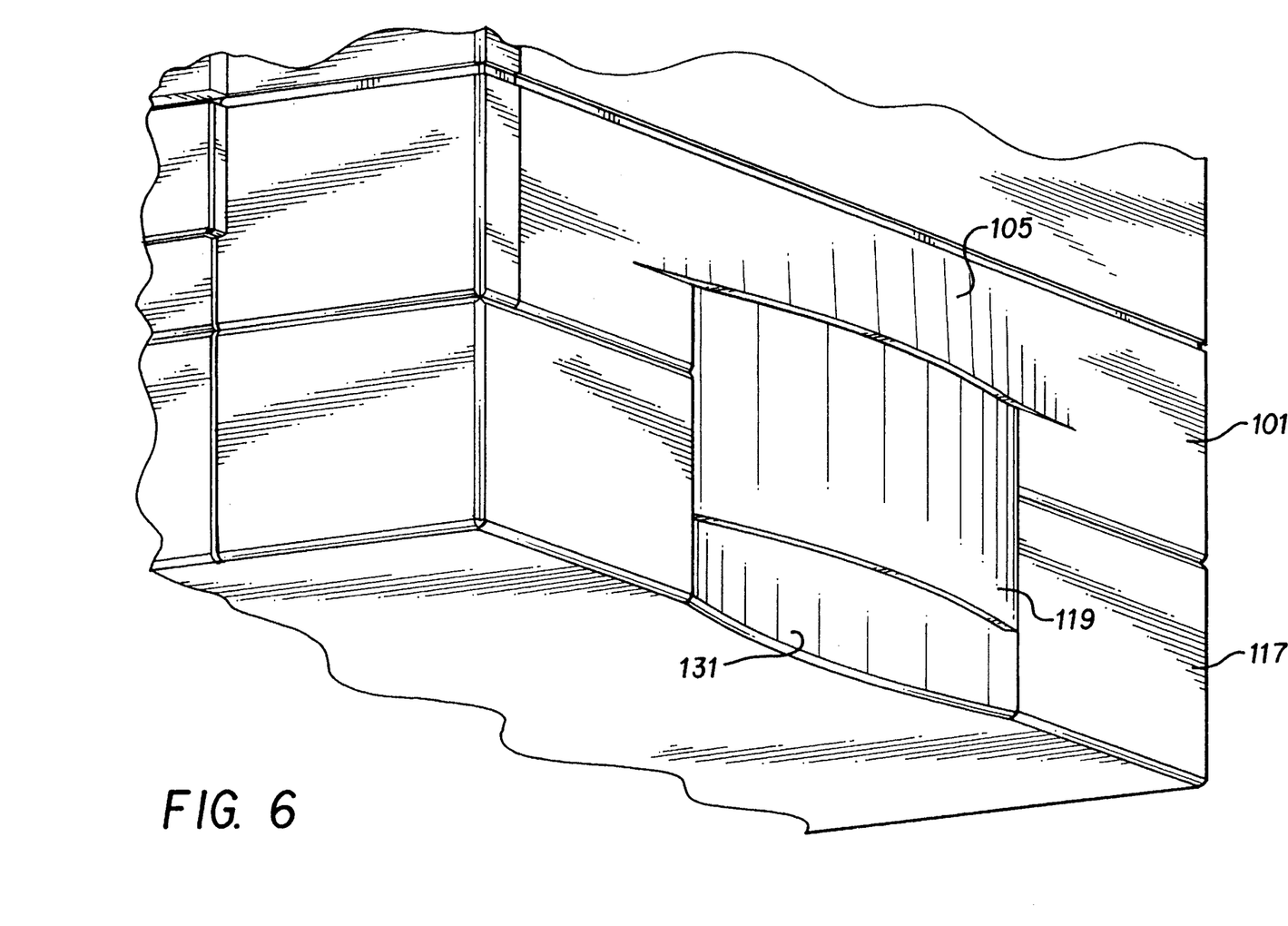
FIG. 6 is a perspective section view from an angle below the present invention as shown in FIG. 2 and FIG. 4.

Additionally, the alignment-handles 119 are dimensioned and located as part of the housing cover 123 so as to mate with the receiving handles 105 of the primary equipment unit 101 as shown in FIGS. 2, 4, and 6. A descending flange member 127 in combination with a cross member 129 and inwardly located descending side wall region 131 of the housing cover 123, similar to those of the primary equipment unit 101, form a downward facing groove 135.

As best seen in FIGS. 1 and 2, the alignment-handle 119 is in effect an asymmetrical T-shaped projection member where the T-stem is horizontal and the T-crossbar has one arm up and one arm down such that the upwardly directed arm acts as a tongue and the downwardly directed arm forms a groove with the descending side wall region 131 of the housing cover 123.

Accessory units 117 tend to be smaller in at least the height dimension than the primary equipment unit 101—for example, a cut sheet media tray may be only about half as high or less than an associated printing apparatus. Therefore, the alignment-handle 119 may be an outward projection that forms downwardly facing groove 135 by providing a simple lower channel-like recess adapted for the fingers of a hand that again will not result in any pinching when the accessory unit 117 is lifted using the recess. In the preferred embodiment, the alignment-handle 119 is contoured as shown in FIGS. 3, 4, 5 and 6 in order to match the warp region 107 of the primary equipment unit 101.

Figure 3:
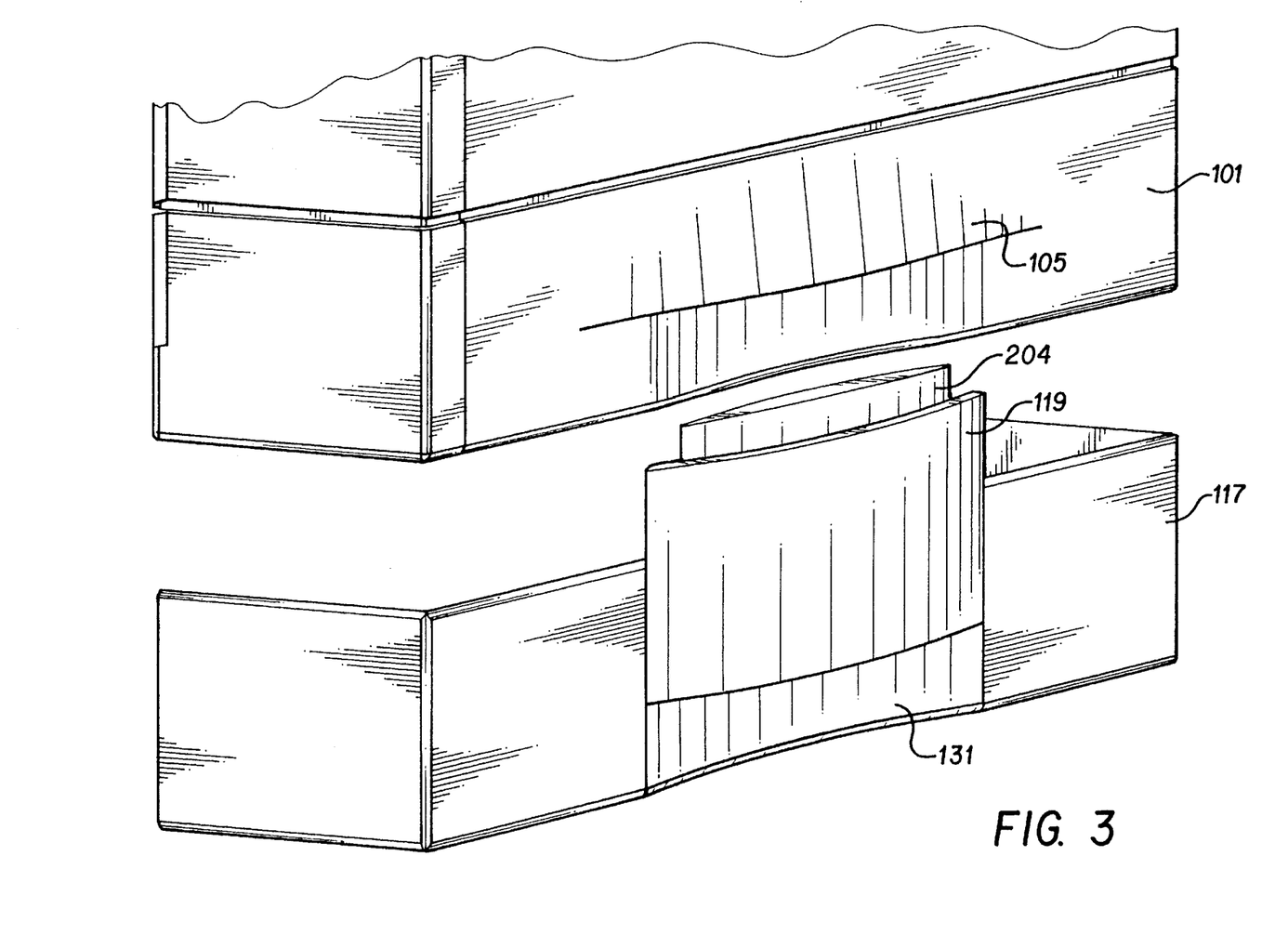
FIG. 3 is a perspective section view from an angle above the present invention as shown in FIG. 1.
Figure 5:
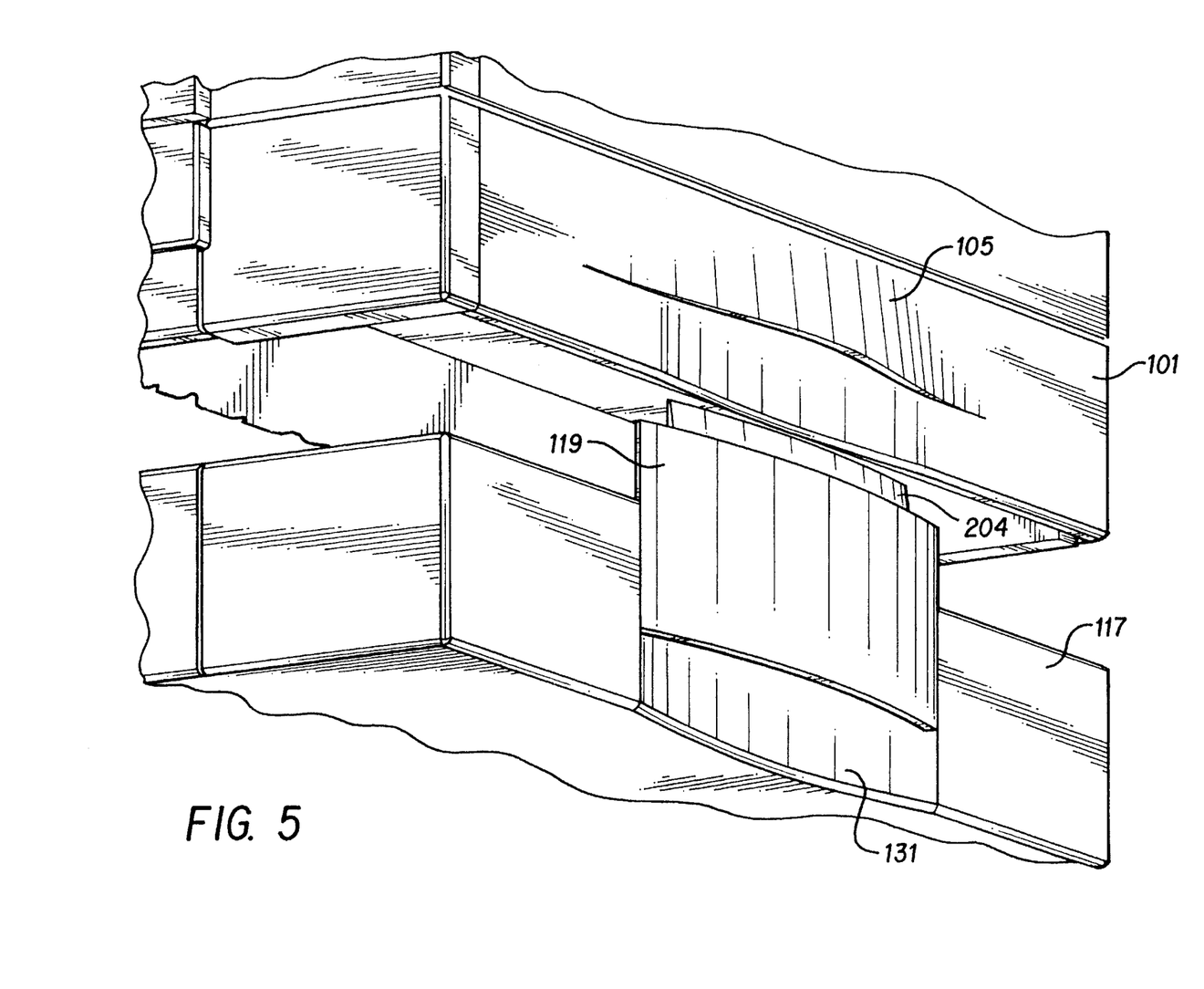
FIG. 5 is a perspective section view from an angle below the present invention as shown in FIG. 1.

Referring primarily to FIG. 2, each alignment-handle 119 includes an ascending tongue member 202, of a shape and size to fit within the groove 125 of the primary equipment unit 101. A stepped upper extremity 204 of the tongue member 202 provides two abutment surfaces 206, 208 for resting the cross member 109 and flange member 115 of the primary equipment unit receiving handle 105 upon, respectively. In other words, the tongue member 202 reaches upwardly from the top 210 surface member of the accessory unit housing cover 123 substantially the same distance (less cover material thicknesses) as the descending region 111 of the primary equipment unit cover 103 reaches downwardly from that unit's cross member 109; lowering the primary equipment unit 101 onto the accessory unit 117 with the receiving handle 105 aligned with the alignment-handle 119 results in a nesting of the two units 101, 117. FIGS. 3 and 5 show the two units 101, 117 just prior to nesting and FIGS. 4 and 6 show the units 101, 117 with the tongue member stepped region 204 (hidden in view) of the alignment-handle 119 engaged in the groove 125 (also hidden in view) of the primary unit 101.

The nested units 101, 117 are essentially secured together merely from the mating of the tongue 204 and groove 125 and the weight of the primary equipment unit 101 sitting atop the accessory equipment unit 117. This tongue-and-groove locating system negates the need for any other interlocking mechanisms between the devices since, once stacked, the units 101, 117 can only be picked up from the lowest unit groove—in this embodiment, groove 135 as shown in FIG. 2.

Figure 7:
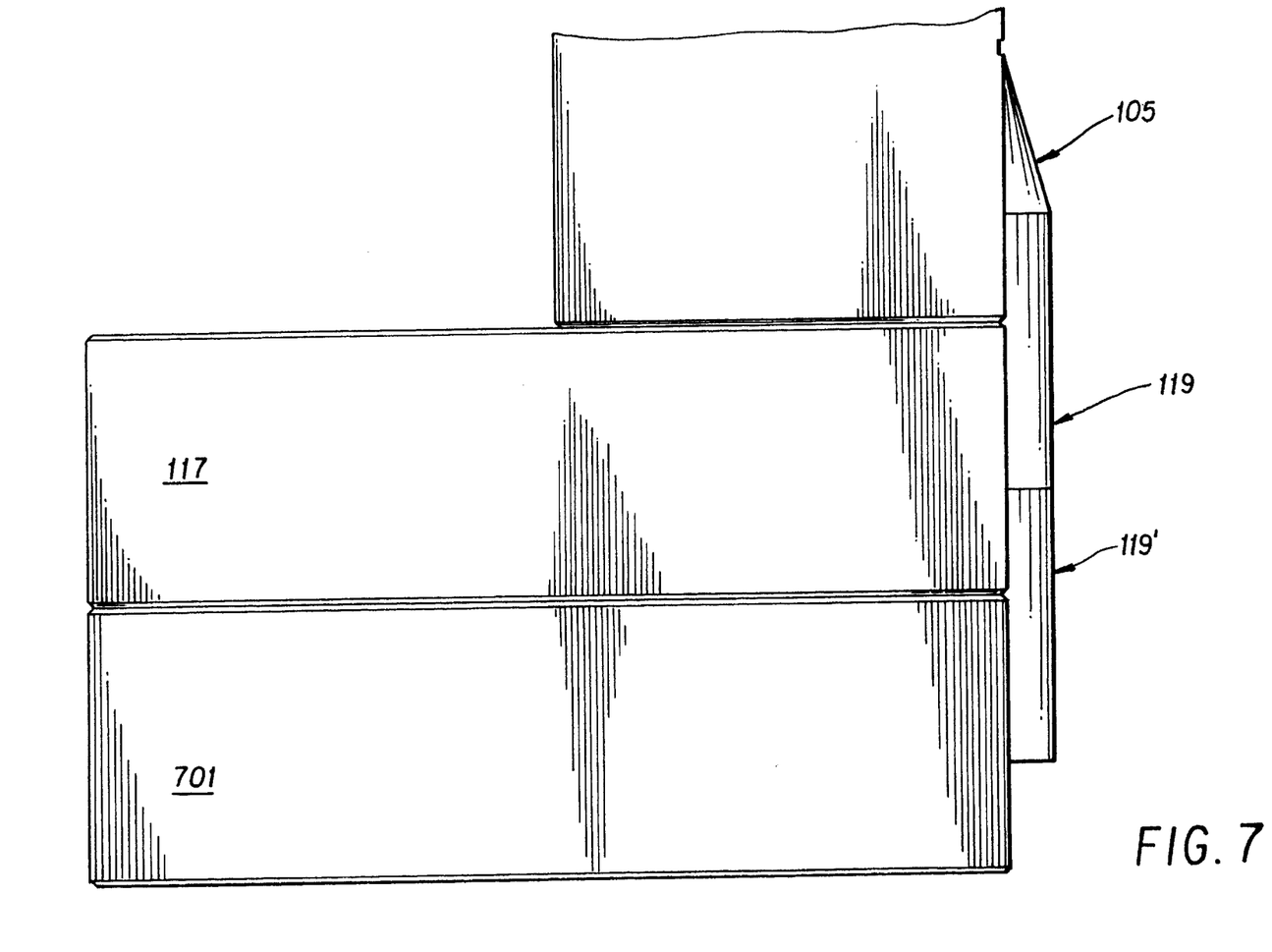
FIG. 7 is a schematic, plan view (front section) of the present invention as shown in FIGS. 2, 4 and 6, showing an additional stacked accessory equipment unit.
Figure 8:
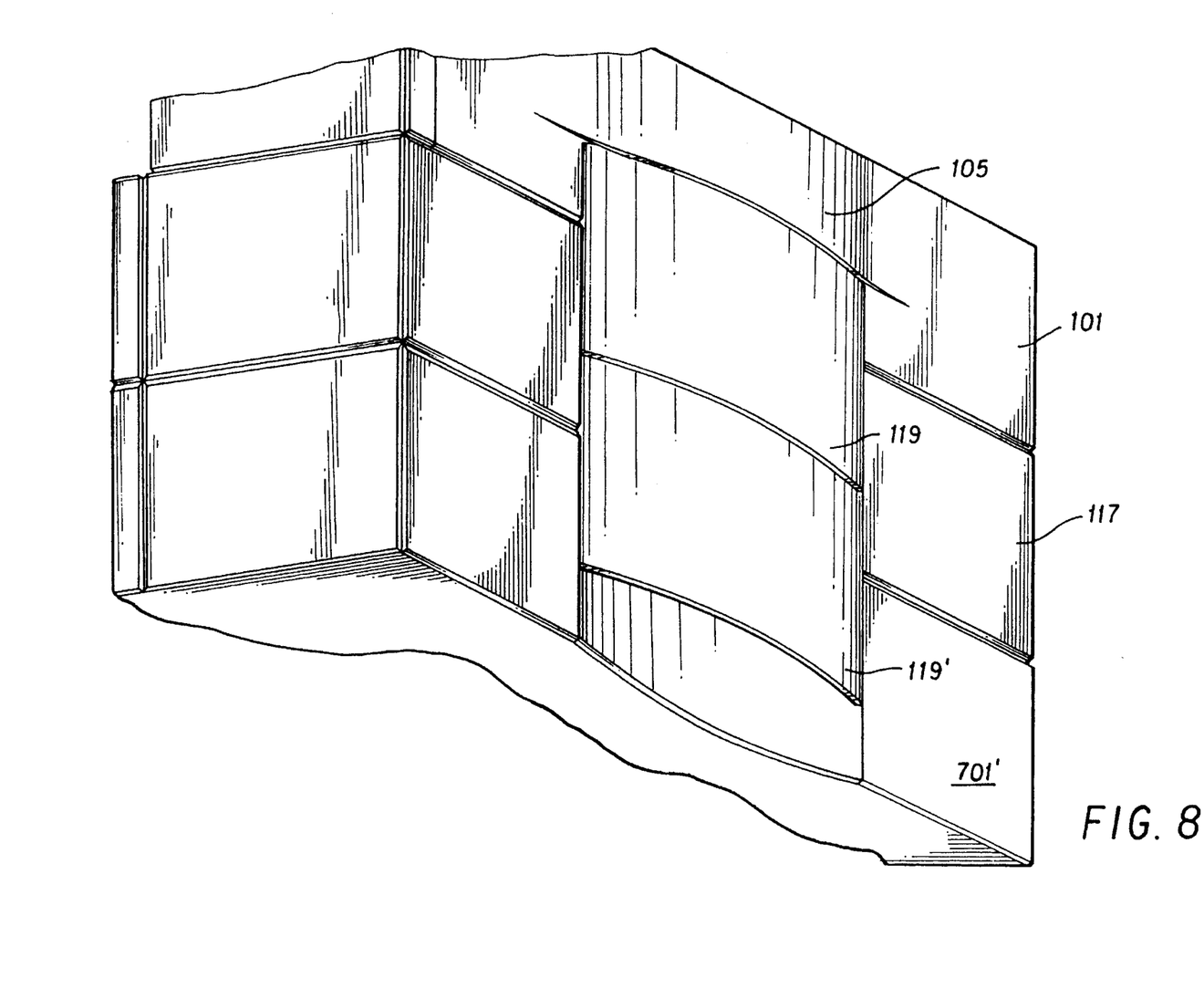
FIG. 8 is a perspective section view from an angle below the present invention as shown in FIG. 7.

In FIGS. 7 and 8, the construct is extended to a second accessory equipment unit 701, having an alignment-handle 119'. It is again worth noting that it is only by the lowest unit in the stack that a handle groove is open for picking up the stacked three units 101, 117, 701 as the tongue member of the middle unit handle engages the groove of the top unit handle. That is, once stacked, upper handle devices of the stack are blocked and the user cannot lift the upper device with it's handles.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. For example, the smooth warped cover regions could be replaced by less attractive but like functional angular cover regions. The important factor is that the tongue members (or at least a stepped region thereof) of subjacent equipment units be complementary in shape and size to fit snugly within an adjacent groove of a superjacent unit. Housings incorporating the present invention can be fabricated of a stamped sheet metal rather than a molded plastic. Moreover, it is contemplated that a system of stacked equipment may have only one set of integrated carry handles and interlocking mechanisms in accordance with the present invention on one side of each and use a less expensive form of handling mechanism on a second side, whereby at least a partial interlock is established. The embodiment was chosen and described in order to best explain the principles of the invention and its best mode practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. In an equipment system having a primary equipment unit and at least one accessory equipment unit, an integrated carry handle and accessory interlock system comprising:

said primary equipment unit having a primary unit housing cover including:

at least one first handle member integrally formed with said primary unit housing cover, said first handle member including an outwardly protruding region of said primary unit housing cover such that a descending flange and downwardly directed groove is formed by said outwardly protruding region of said primary unit housing cover and said descending flange; and each of said accessory equipment units having an accessory unit housing cover including:

at least one second handle member integrally formed with said accessory unit housing cover, having a substantially planar, horizontal, rectangular top member and walls descending peripherally about said top member, said second handle member including an upwardly directed tongue member for at least partial insertion into said downwardly directed groove of said first handle member, said tongue member having a lower descending outer flange, and a recess below said tongue member descending outer flange for lifting said accessory equipment unit thereby, said recess having a shape and dimensions such that a tongue member of a subjacent accessory equipment unit is received into said recess, and said housing cover including a substantially horizontal cross member between said descending outer flange and one of said descending walls of said accessory unit housing cover, forming a downwardly directed groove beneath said tongue member, whereby stacking said primary equipment unity on at least one accessory equipment unit interlocks said primary equipment unit and said accessory equipment unit using said tongue member and said groove of said first handle member.

2. The system as set forth in claim 1, said first handle member further comprising:

an inwardly directed, substantially horizontal, cross member coupled to said outwardly protruding region and said primary unit housing cover above a lowermost reach of said descending flange.

3. The system as set forth in claim 2, further comprising:

said primary unit housing cover is a molded plastic construction; and said first handle member is a warp region comprising an outward bulge in said construction.

4. The system as set forth in claim 2, further comprising:

said downwardly directed groove of said first handle member has a shape and dimension to accommodate use as a lifting handle.

5. The system as set forth in claim 2, further comprising:

said recess of said second handle member has a shape and dimension to accommodate use as a lifting handle.

6. The system as set forth in claim 2, further comprising:

said recess of said second handle member has a shape and dimensions to accommodate a tongue member of a subjacently stacked accessory equipment unit.

7. The system as set forth in claim 1, further comprising:

said tongue member has a stepped outer surface region on an upper extremity thereof such that said cross member and said descending flange of said first handle member abut said stepped outer surface region when said tongue member is inserted into said downwardly directed groove of said first handle member.

* * * * *